United States Patent
Cheng et al.

(10) Patent No.: US 10,217,867 B2
(45) Date of Patent: Feb. 26, 2019

(54) UNIFORM FIN DIMENSIONS USING FIN CUT HARDMASK

(71) Applicant: INTERNATIONAL BUSINESS MACHINES CORPORATION, Armonk, NY (US)

(72) Inventors: Kangguo Cheng, Schenectady, NY (US); Peng Xu, Guilderland, NY (US)

(73) Assignee: International Business Machines Corporation, Armonk, NY (US)

(*) Notice: Subject to any disclaimer, the term of this patent is extended or adjusted under 35 U.S.C. 154(b) by 12 days.

(21) Appl. No.: 15/258,378

(22) Filed: Sep. 7, 2016

(65) Prior Publication Data

US 2018/0069113 A1    Mar. 8, 2018

(51) Int. Cl.
| | |
|---|---|
| H01L 29/78 | (2006.01) |
| H01L 21/308 | (2006.01) |
| H01L 21/3105 | (2006.01) |
| H01L 29/66 | (2006.01) |
| H01L 21/762 | (2006.01) |
| H01L 29/06 | (2006.01) |
| H01L 27/088 | (2006.01) |

(52) U.S. Cl.
CPC ........ *H01L 29/785* (2013.01); *H01L 21/3086* (2013.01); *H01L 21/31055* (2013.01); *H01L 21/76224* (2013.01); *H01L 27/0886* (2013.01); *H01L 29/0649* (2013.01); *H01L 29/66795* (2013.01); *H01L 29/7846* (2013.01)

(58) Field of Classification Search
CPC ............. H01L 29/785; H01L 29/66795; H01L 27/7846
See application file for complete search history.

(56) References Cited

U.S. PATENT DOCUMENTS

| | | | |
|---|---|---|---|
| 8,569,152 B1 | 10/2013 | Basker et al. | |
| 8,617,996 B1 | 12/2013 | Chi et al. | |
| 8,658,536 B1 | 2/2014 | Choi et al. | |
| 8,835,262 B2 | 9/2014 | Cai et al. | |
| 8,846,490 B1 | 9/2014 | Shieh et al. | |
| 8,906,807 B2 | 12/2014 | Bergendahl et al. | |
| 8,932,957 B2 | 1/2015 | Shieh et al. | |
| 8,946,792 B2 | 2/2015 | Cheng et al. | |
| 9,209,095 B2 | 12/2015 | Chang et al. | |
| 9,252,022 B1 | 2/2016 | Dechene et al. | |
| 2005/0200297 A1* | 9/2005 | Lee | B41J 2/04541 315/169.1 |
| 2012/0049294 A1* | 3/2012 | Chen | H01L 21/823431 257/401 |
| 2015/0076609 A1 | 3/2015 | Xie et al. | |
| 2015/0228499 A1 | 8/2015 | Parkinson et al. | |
| 2016/0013183 A1 | 1/2016 | Basker et al. | |
| 2016/0043223 A1 | 2/2016 | Xie et al. | |
| 2017/0047432 A1* | 2/2017 | Ching | H01L 29/785 |
| 2017/0053835 A1* | 2/2017 | Sung | H01L 21/823821 |

* cited by examiner

*Primary Examiner* — Thao X Le
*Assistant Examiner* — Geoffrey Ida
(74) *Attorney, Agent, or Firm* — Tutunjian & Bitetto, P.C.; Vazken Alexanian (57) ABSTRACT

A method for forming fins includes patterning a fin cut mask over a fin etch mask to protect the fin etch mask in a fin region and etching a substrate in accordance with the fin cut mask to form fin cut regions. A first dielectric fill material is formed in the fin cut regions. The fin etch mask is exposed by removing the fin cut mask. Fins in the substrate are etched using the fin etch mask.

14 Claims, 8 Drawing Sheets

UNIFORM FIN DIMENSIONS USING FIN CUT HARDMASK

BACKGROUND

Technical Field

The present invention generally relates to semiconductor processing, and more particularly to fin formation using a hardmask to provide uniform fin dimensions through an array of fins.

Description of the Related Art

With complementary metal oxide semiconductor (CMOS) field effect transistor (FET) scaling down, a smaller fin cut process window is induced after fin formation. A fin cut process includes cutting a length of a fin or forming cut regions around or in between dense fin regions. Fin spikes can result if there is a large overlay in the process window.

Fin formation and fin cut regions can be formed in a single etching process. This can lead to different critical dimensions for the fins. In other processes, a fin cut etch includes an isotropic etch while dense fin regions are anisotropically etched. This leads to different critical dimensions for the fins on an outside of the dense fin regions. Due to this, outside fins often include a larger width (critical dimension) than the fins within the dense fin region.

SUMMARY

In accordance with an embodiment of the present invention, a method for forming fins includes patterning a fin cut mask over a fin etch mask to protect the fin etch mask in a fin region and etching a substrate in accordance with the fin cut mask to form fin cut regions. A first dielectric fill material is formed in the fin cut regions. The fin etch mask is exposed by removing the fin cut mask. Fins in the substrate are etched using the fin etch mask.

Another method for forming fins includes forming a fin etch mask on a substrate; patterning a fin cut mask over a fin region of the fin etch mask to protect the fin etch mask in the fin region; etching a substrate in accordance with the fin cut mask to form fin cut regions outside of the fin region; forming a first dielectric fill material in the fin cut regions; planarizing the first dielectric fill and the fin cut mask to a height of the fin etch mask; exposing the fin etch mask by removing the fin cut mask; etching fins in the substrate using the fin etch mask; and forming a shallow trench isolation region in the fin cut regions and the fin region.

A semiconductor device includes a substrate and a fin region formed in the substrate and including fins formed from the substrate. At least one fin cut region is formed in the substrate adjacent to the fin region and having a different depth in the substrate than the fin region. A dielectric fill material is recessed in the fin cut regions and the fin region to form a shallow trench isolation region having substantially a same height in the fin cut regions and the fin region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

In accordance with aspects of the present invention, methods and devices are provided that include fins fabricated with a substantially uniform width across a fin region. The present embodiments provide a fin cut mask that is formed over a fin etch mask to protect the fin etch mask during fin cut etching. The fin cut mask and the fin etch mask are aligned to one another to prevent a large overlay mismatch and to ensure that sufficient substrate material remains on end portions. The sufficient material can provide a buffer to ensure that fins at the ends of a fin region are not overetched by the multiple etch processes. The fins in the fin region are formed by a pristine fin etch mask which etches all of the fins in a same etch process and forms all fins with a same width (or other critical dimension).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms e intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
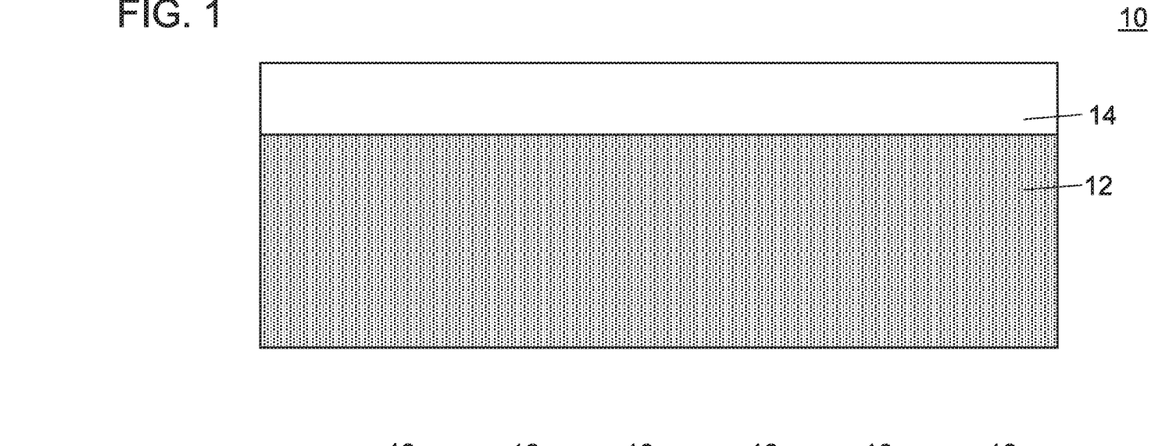
FIG. 1 is a cross-sectional view showing a substrate having a hardmask layer formed thereon in accordance with aspects of the present invention.

Referring now to the drawings in which like numerals represent the same or similar elements and initially to FIG. 1, a partially fabricated semiconductor device 10 is shown having a hardmask 14 formed on a substrate 12. The substrate 12 can include a bulk-semiconductor substrate. In one example, the bulk-semiconductor substrate 12 can be a silicon-based material. Illustrative examples of silicon-based materials suitable for the bulk-semiconductor substrate 12 include, but are not limited to, Si, SiGe, SiGeC, SiC, etc. and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride, zinc selenide, etc. Although not depicted in FIG. 1, the semiconductor substrate 12 can also be a semiconductor on insulator (SOI) substrate.

The hardmask 14 can include a dielectric material, such as a nitride, an oxynitride, or other suitable hardmask material. The hardmask 14 can be deposited using a chemical vapor deposition process (CVD), although other deposition processes are contemplated.

Figure 2:
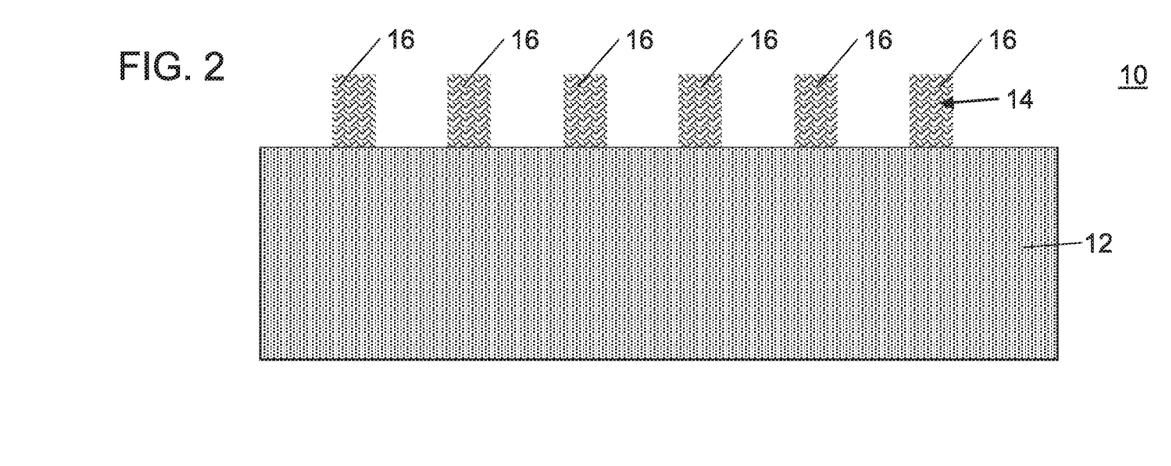
FIG. 2 is a cross-sectional view showing the hardmask layer of FIG. 1 patterned to form a fin etch mask in accordance with aspects of the present invention.

Referring to FIG. 2, the hardmask 14 is patterned to identify positions for fin formation. The hardmask 14 can be patterned by employing a lithographic patterning process, a spacer image transfer (SIT) process (e.g., self-aligned quadruple patterning (SAQP) or a self-aligned double patterning (SADP)), etc. to form a fin etch mask 16.

Figure 3:
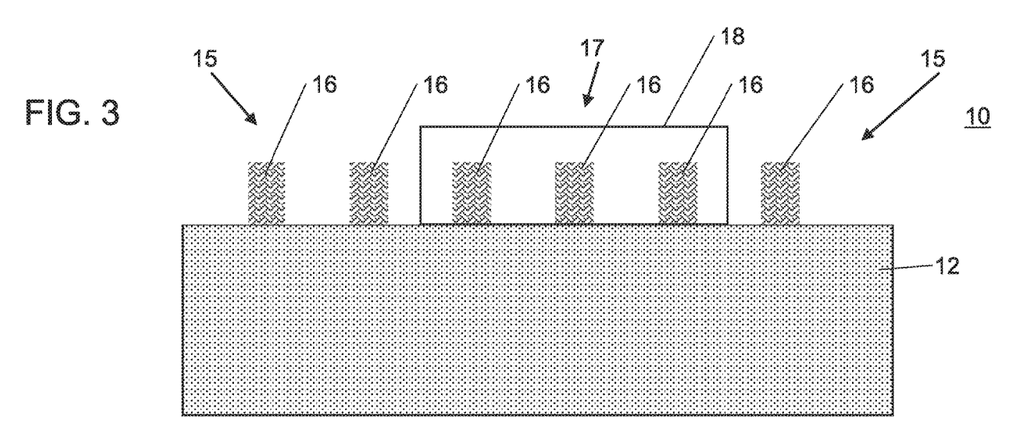
FIG. 3 is a cross-sectional view showing a fin cut mask formed over the fin etch mask of FIG. 2 in accordance with aspects of the present invention.

Referring to FIG. 3, a fin cut mask 18 is deposited over the fin etch mask 16. The fin cut mask 18 is patterned by employing a lithographic patterning process. The fin cut mask 18 defines regions 17 of dense fins and regions 15 where a fin cut will be formed. The fin cut mask 18 can include a photoresist or dielectric material that can be removed selectively without damage to the fin etch mask 16 and substrate 12.

Figure 4:
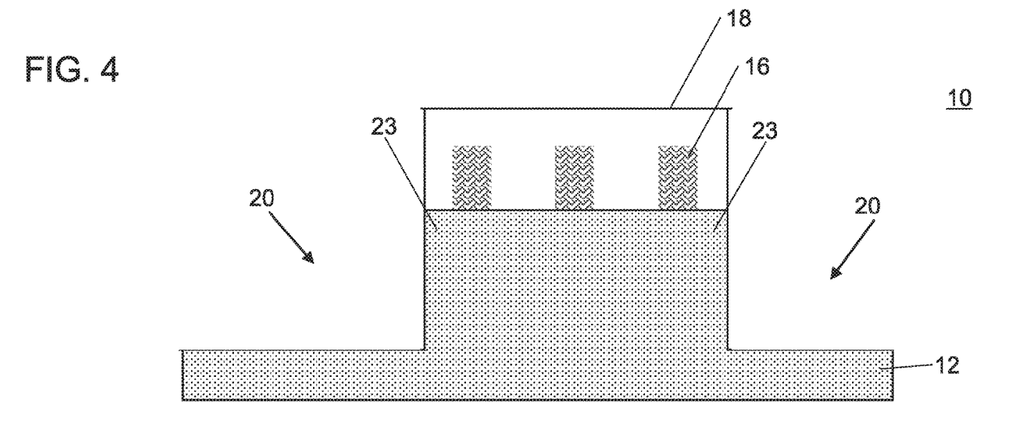
FIG. 4 is a cross-sectional view showing fin cut regions formed adjacent to a fin region in accordance with aspects of the present invention.

Referring to FIG. 4, fin cuts 20 are etched into the substrate 12. The fin cuts 20 are formed by using, e.g., a reactive ion etch (RIE) process to etch the substrate 12 in accordance with the fin cut mask 18. The substrate 12 is etched to a desired depth.

Figure 5:
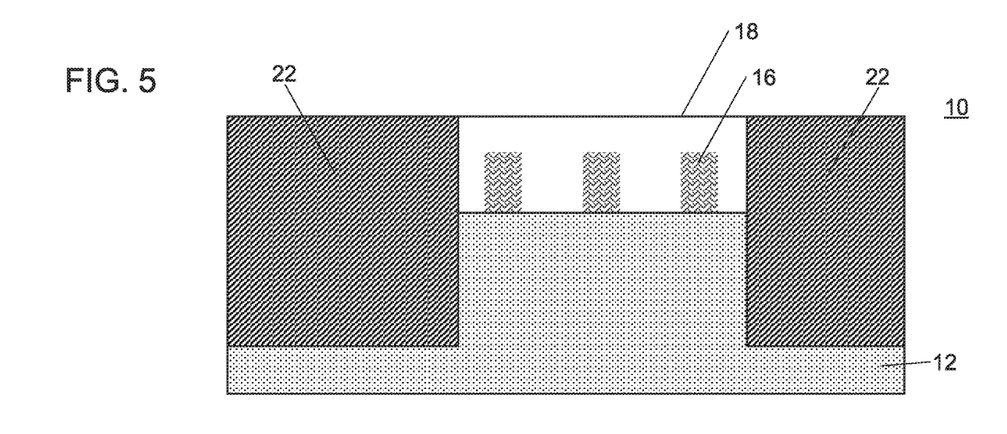
FIG. 5 is a cross-sectional view showing the fin cut regions of FIG. 4 filled with a dielectric material in accordance with aspects of the present invention.

Referring to FIG. 5, a deposition process is employed to form a dielectric fill material, which can be referred to as shallow trench isolation (STI) regions 22. The deposition process can include a CVD process or a high density plasma deposition (HDP) process. The STI regions 22 can include an oxide, such as a silicon oxide, although other dielectric materials can be employed. The STI regions 22 can be formed up to and over the fin cut mask 18.

Figure 6:
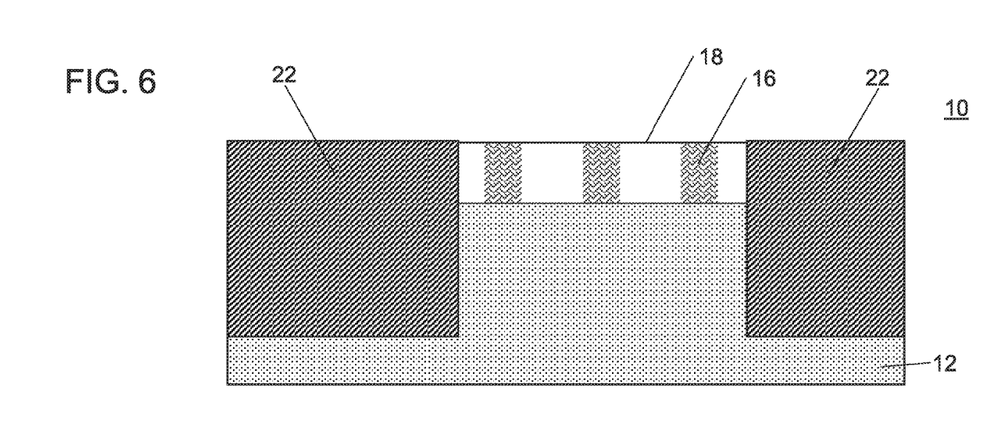
FIG. 6 is a cross-sectional view showing the fin cut mask and dielectric material in fin cut regions of FIG. 5 planarized in accordance with aspects of the present invention.

Referring to FIG. 6, a planarization process can be performed to remove material down to the fin etch mask 16. The planarization process can include a chemical mechanical polish (CMP) process. The CMP removes excess material of the mask 18 and the STI regions 22.

Figure 7:
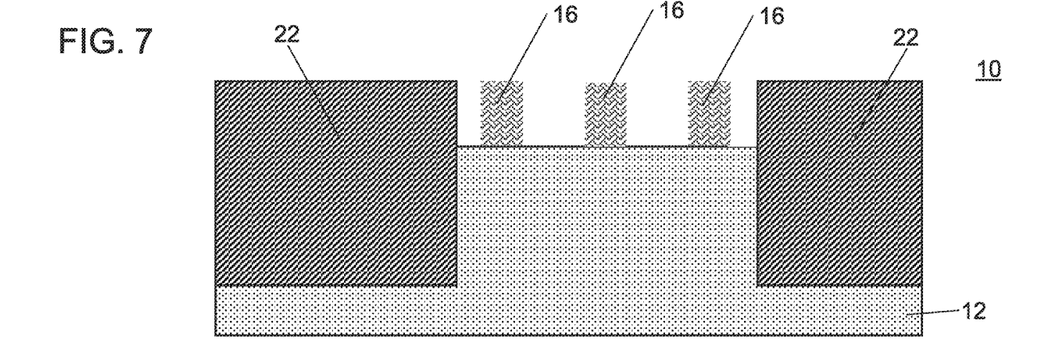
FIG. 7 is a cross-sectional view showing the fin cut mask removed in accordance with aspects of the present invention.

Referring to FIG. 7, the fin cut mask 18 is removed to expose the fin etch mask 16. The fin cut mask 18 can be removed by a selective etch process.

Figure 8:
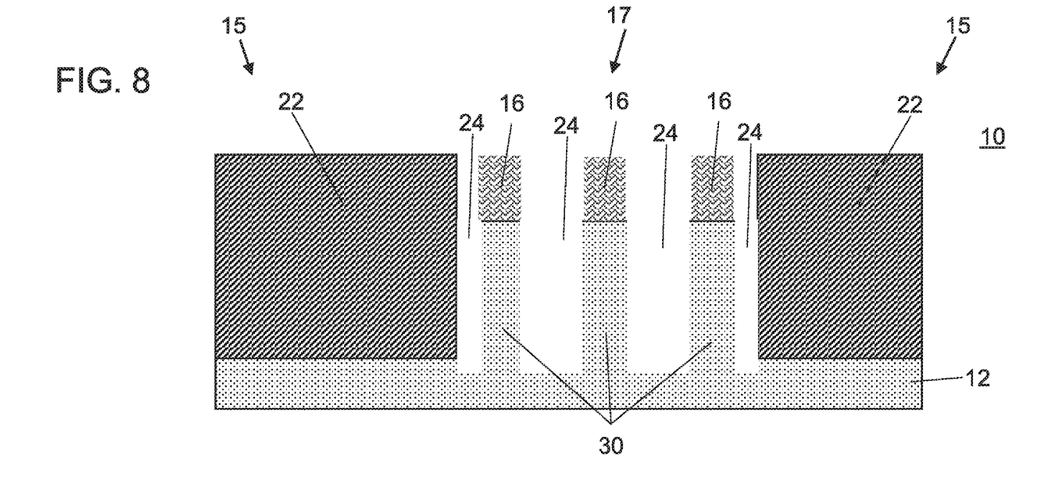
FIG. 8 is a cross-sectional view showing the fin etch mask used to etch fins in the substrate in the fin region in accordance with aspects of the present invention.

Referring to FIG. 8, a RIE etch is performed to etch the substrate 12 in accordance with the fin etch mask 16. Fin formation includes etching trenches 24 to a depth in the substrate 12. Fin trench depth can be different in the fin region 17 than in the fin cut regions 15. The trench 24 depth in the fin cut regions 15 can be the same, shallower, or deeper than the trench depth (top of the substrate 12) in fin region 17.

For all fins 30 formed in the dense region (fin region 17), the fin's critical dimensions (CD) will be substantially the same (e.g., +/−10% or better, or within acceptable tolerance for a process of record) regardless of their location relative to the fin cut regions 15. For example, all fins 30 will have a substantially same width dimension.

In one embodiment, the fin etch mask 16 is overlaid (located) within the fin cut mask 18 to ensure that the end fins 30 have sufficient material to permit trench etching to provide sufficient thickness to the fins 30. This includes spacing the last fin etch mask 16 feature far enough from the end (fin cut region 20 (FIG. 4)) to provide a buffer region 23 between an edge of the fin cut region 20 and the end fin etch mask features (16). In this way, the RIE etch is employed to form the fins 30 and accumulated etch damage on the end fins is eliminated.

Additional processing continues with the formation of a shallow trench isolation (STI) region at the base of the fins 30. The formation of an STI in the fin region 17 can include one of several options, as will be described below.

Figure 9:
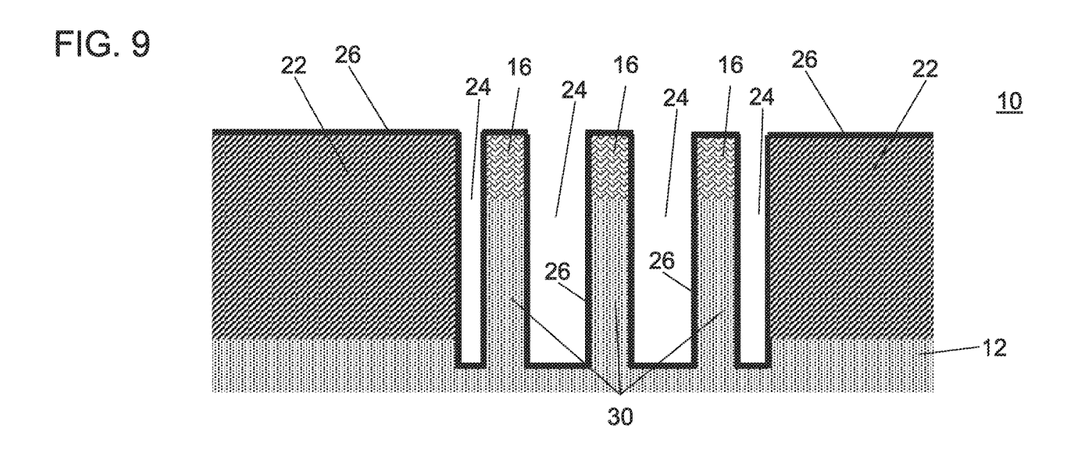
FIG. 9 is a cross-sectional view showing a fin liner formed on the dielectric fill and over the fins in accordance with one embodiment of the present invention.

Referring to FIG. 9, one embodiment is shown for the formation of an STI in the fin region 17. A fin liner 26 is formed. The fin liner 26 can include a dielectric material, such as, e.g., a nitride. The fin liner 26 can be conformally formed on exposed surfaces of substrate 12 (including fins 30 and fin etch mask 16) and STI regions 22. The fin liner 26 can be employed to protect the fins 30 in subsequent processing.

Figure 10:
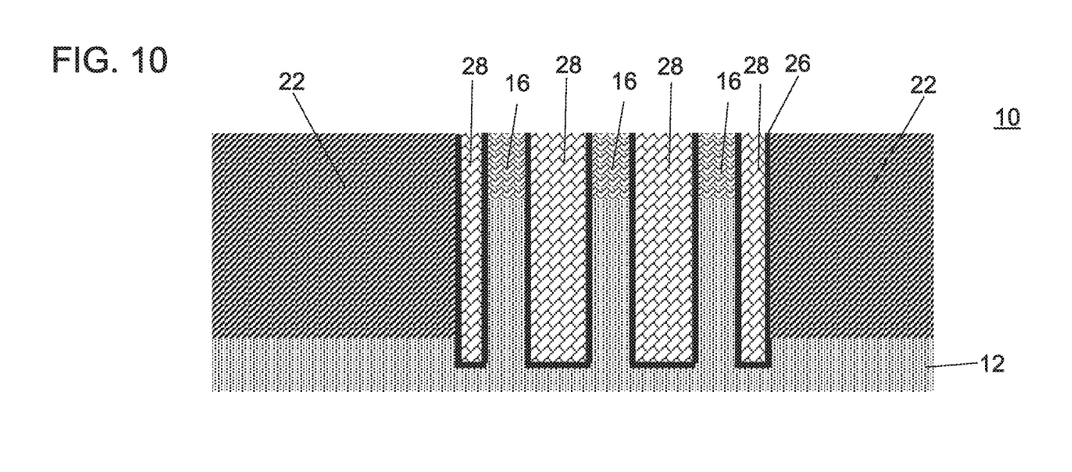
FIG. 10 is a cross-sectional view showing another dielectric fill formed on the fin liner between fins in accordance with one embodiment of the present invention.

Referring to FIG. 10, a deposition process is employed to form a fill 28 in the fin region 17. The deposition process can include a CVD process or HDP process. The fill 28 can include an oxide, such as a silicon oxide, although other dielectric materials can be employed. The fill 28 can be formed up to and over the fin etch mask 16 and liner 26. A planarization process can be performed to remove material down to the fin etch mask 16. The planarization process can include a CMP process.

Figure 11:
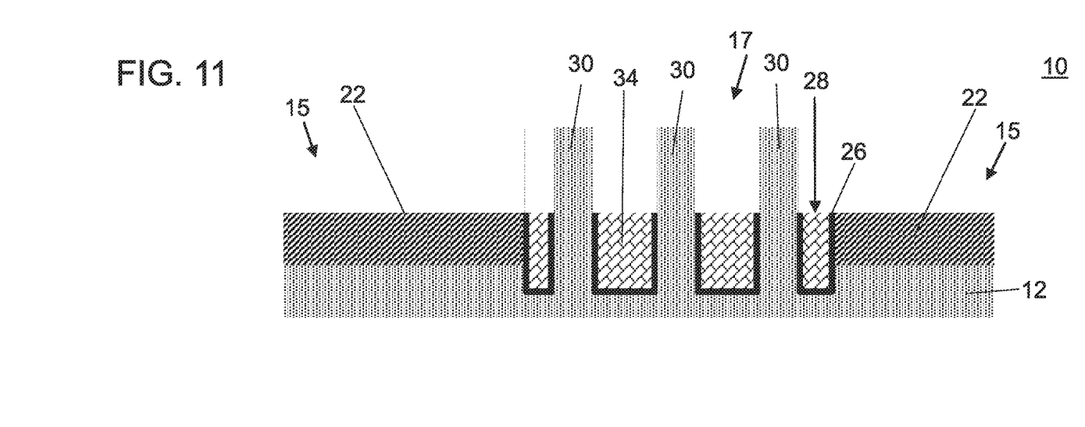
FIG. 11 is a cross-sectional view showing the dielectric fill (two components) and the fin liner recessed to form a shallow trench isolation region in accordance with one embodiment of the present invention.

Referring to FIG. 11, an STI recess etch is performed to recess the fill 28 to a predetermined depth to form an STI region 34 at the base of fins 30 in the fin region 17. The STI regions 22 can also be concurrently recessed to the predetermined depth. Next, the fin hardmask 16 and the fin liner in exposed areas are removed by a selective etch to obtain the configuration of FIG. 11. The STI regions 22 and 34 are formed across the device 10 and can include a level top surface across each region (15, 17). The fins 30 will now be employed in forming gate structures, source and drain regions and any other useful structures. The additional structures can include any number of materials and components for forming fin field effect transistors (finFETs).

Figure 12:
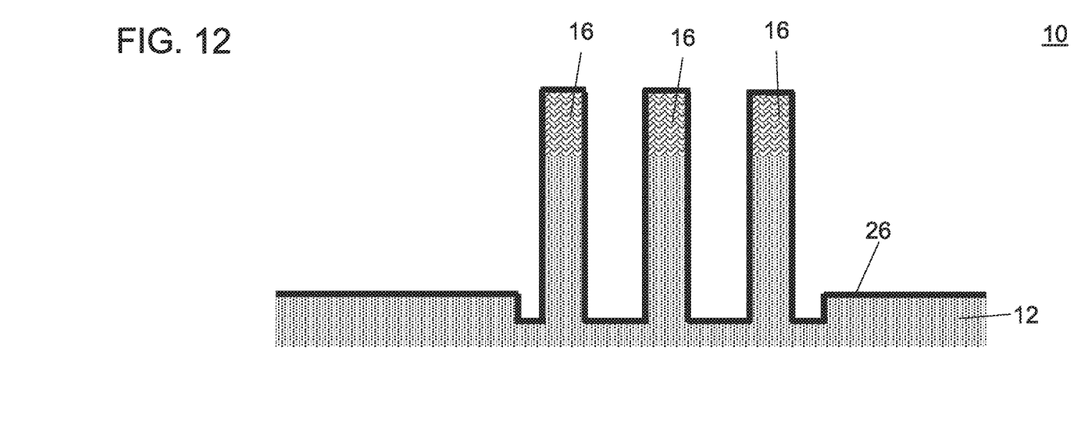
FIG. 12 is a cross-sectional view showing a fin liner formed over the substrate and between fins in accordance with another embodiment of the present invention.

Referring to FIG. 12, in accordance with another embodiment, an etch process is performed to selectively remove the STI regions 22 from the substrate 12. A fin liner 26 is then formed. The fin liner 26 can include a dielectric material, such as, e.g., a nitride. The fin liner 26 can be conformally formed on exposed surfaces of substrate 12 (and fins 30 and fin etch mask 16). The fin liner 26 can be employed to protect the fins 30 in subsequent processing.

Figure 13:
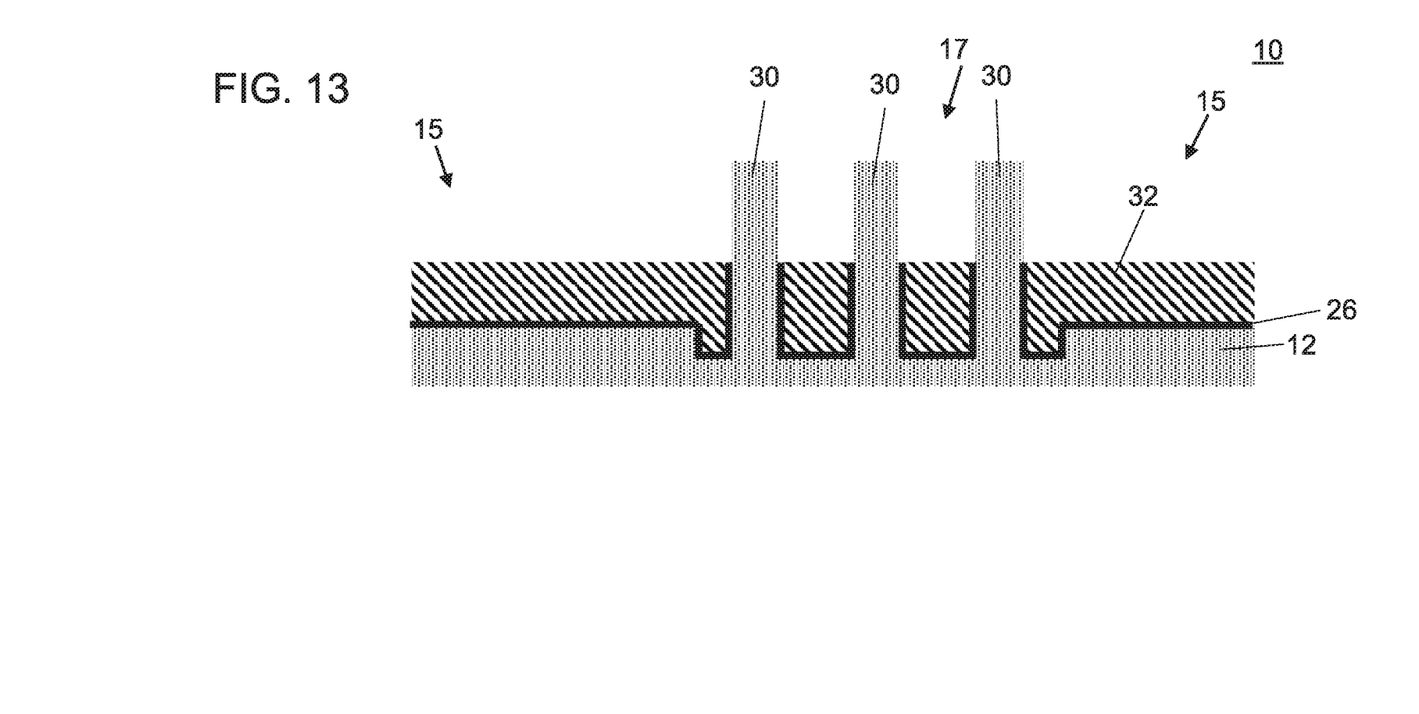
FIG. 13 is a cross-sectional view showing the dielectric fill (one component) and the fin liner recessed to form a shallow trench isolation region in accordance with an embodiment of the present invention.

Referring to FIG. 13, a deposition process is employed to form a fill 32 in the fin region 17 and the fin cut regions 15. The deposition process can include a CVD process or HDP process. The fill 32 can include an oxide, such as a silicon oxide, although other dielectric materials can be employed. The fill 32 can be formed up to and over the fin 30 and recessed back by a planarization process (e.g., CMP) and etch back process. Alternatively, the fill 32 can be formed followed by an etch back process to expose a portion of the fins 30. Next, the fin hardmask 16 and the fin liner 26 in exposed areas are removed by a selective etch to obtain the configuration of FIG. 13. Now, the STI regions 32 are formed across the device 10 and can include a level top surface across each region (15, 17). The fins 30 will now be employed in forming gate structures, source and drain regions and any other useful structures. The additional structures can include any number of materials and components for forming, e.g., fin field effect transistors (finFETs), although the fins 30 can be employed for other device and applications.

The structures of FIGS. 11 and 13 can be provided to a semiconductor device fabricator as a substrate with prepared fins in accordance with aspects of the present invention. The fabricators can order the substrates and continue processing in accordance with a device design. Processing can continue by employing the fins 30 as channels for fin field effect transistor devices. A gate dielectric and gate conductor are formed over the fins and patterned. A gate first or gate last procedure can be employed. A gate last procedure includes forming a dummy gate, which is replaced in later processing (e.g., after source and drain regions are formed). The gate first procedure includes forming the gate and then forming other features (e.g., source and drain regions). Source and drain regions can be formed by epitaxial growth on the fins on opposite sides of the gate.

Figure 14:
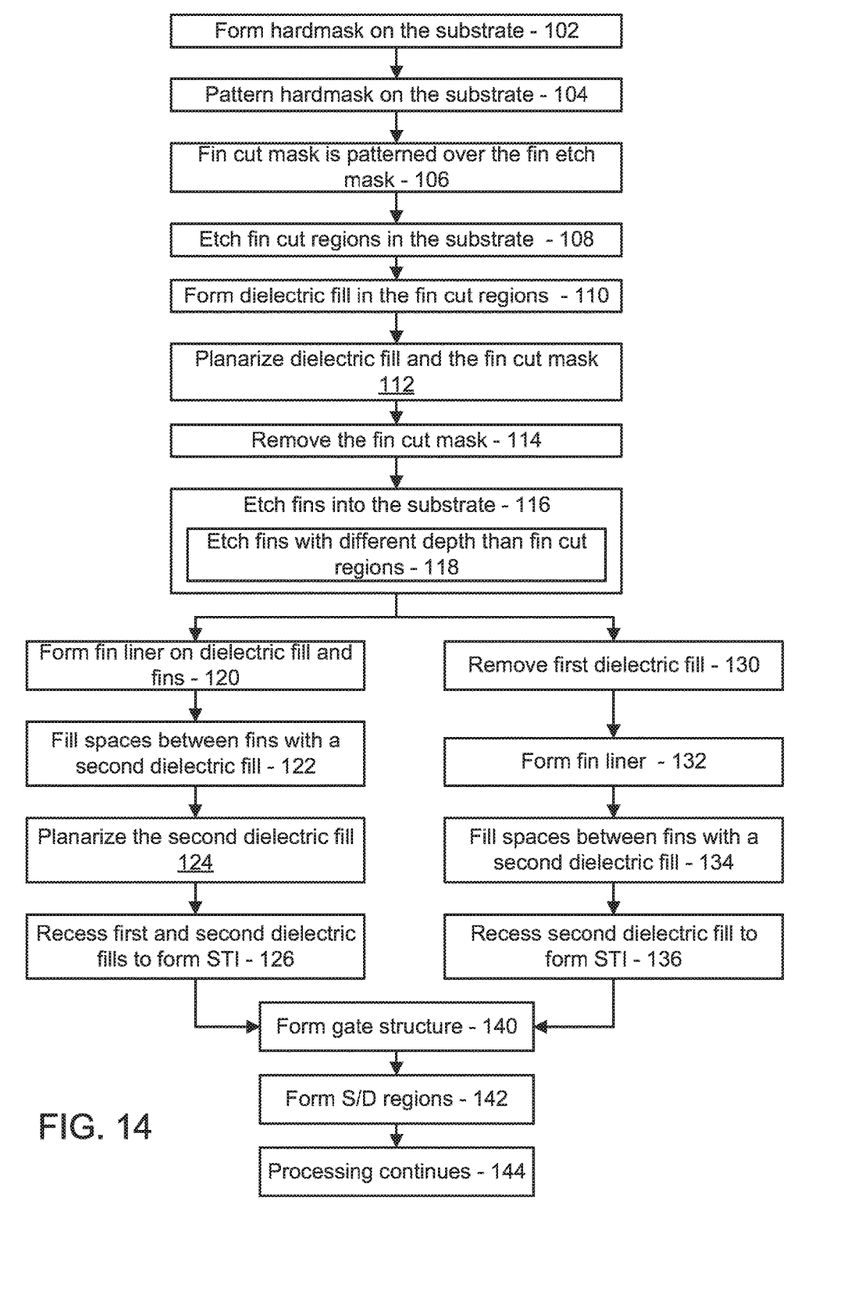
FIG. 14 is a block/flow diagram showing methods for forming a semiconductor device with uniform fins in accordance with aspects of the present invention.

Referring to FIG. 14, methods for forming fins are illustrative described in accordance with aspects of the present invention. In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a fin hardmask layer is formed on a substrate. In one embodiment, the hardmask layer can include a dielectric, such as a nitride. In other embodiments, the hardmask can include a photoresist or the like. In block 104, a fin etch mask is patterned from the hardmask using lithography, a SIT process (e.g., SAQP or SADP, etc.). In block 106, a fin cut mask is patterned over a fin etch mask to protect the fin etch mask in a fin region. In a useful embodiment, the fin cut mask can be positioned over the fin etch mask to ensure that the fins, when etched are substantially the same width.

In block 108, the substrate is etched in accordance with the fin cut mask to form fin cut regions. In block 110, a first dielectric fill material is formed in the fin cut regions. In block 112, the first dielectric fill and the fin cut mask can be planarized to a top of the fin etch mask features. The planarization can be performed by CMP. In block 114, the fin cut mask is removed to expose the features of the fin etch mask in the fin region.

In block 116, fins are etched into the substrate using the fin etch mask. In block 118, the substrate is etched in the fin region to a different depth than the fin cut regions. This can include a shallower or deeper (or the same) depth between the fin region base and a top of the substrate in the fin cut regions. Processing can continue in several ways.

In accordance with one embodiment, in block 120, a fin liner is formed on the first dielectric fill material and exposed portions of the substrate. In block 122, spaces between the fins are filled by depositing a second dielectric fill over the fin liner. In block 124, the second dielectric fill is planarized down to the fin etch mask. In block 126, the first dielectric fill and the second dielectric fill are recessed to form a shallow trench isolation region in the fin cut regions and the fin region. The fin etch mask is then removed in block 128.

In accordance with another embodiment, in block 130, the first dielectric fill is removed. In block 132, a fin liner is formed on exposed portions of the substrate including the fins. In block 134, spaces between the fins are filled by depositing a second dielectric fill. In block 136, the second dielectric fill is recessed to form a shallow trench isolation region in the fin cut regions and the fin region.

In block 140, a gate structure is formed. The gate structure can include a dummy gate, a metal gate, a gate dielectric, sidewalls spacers, etc. In block 142, source and drain (S/D) regions are formed. In one embodiment, the source and drain regions can be formed on the fins by epitaxial growth with in-situ doping. In block 144, processing continues to complete the device.

Having described preferred embodiments for uniform fin dimensions using fin cut hardmask (which are intended to be illustrative and not limiting), it is noted that modifications and variations can be made by persons skilled in the art in light of the above teachings. It is therefore to be understood that changes can be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming fins, comprising:
    patterning a fin cut mask over a fin etch mask to protect the fin etch mask in a fin region;
    etching a substrate using the fin cut mask to form fin cut regions;
    forming first dielectric fill material in the fin cut regions;
    after forming the first dielectric fill material in the fin cut regions, exposing the fin etch mask by removing the fin cut mask; and
    after exposing the fin etch mask, etching fins in the substrate using the fin etch mask.

2. The method as recited in claim 1, further comprising:
    forming a fin liner on the first dielectric fill material and exposed portions of the substrate.

3. The method as recited in claim 2, further comprising:
    filling spaces between the fins by depositing a second dielectric fill over the fin liner;
    planarizing the second dielectric fill down to the fin etch mask; and
    recessing the first dielectric fill and the second dielectric fill to form a shallow trench isolation region in the fin cut regions and the fin region.

4. The method as recited in claim 3, further comprising removing the fin etch mask.

5. The method as recited in claim 1, further comprising:
    removing the first dielectric fill; and
    forming a fin liner on exposed portions of the substrate including the fins.

6. The method as recited in claim 5, further comprising:
    filling spaces between the fins by depositing a second dielectric fill; and
    recessing the second dielectric fill to form a shallow trench isolation region in the fin cut regions and the fin region.

7. The method as recited in claim 1, wherein etching the fins in the substrate using the fin etch mask includes etching the substrate in the fin region to a different depth than the fin cut regions.

8. A method for forming fins, comprising:
    forming a fin etch mask on a substrate;
    patterning a fin cut mask over a fin region of the fin etch mask to protect the fin etch mask in the fin region;
    etching the substrate using the fin cut mask to form fin cut regions outside of the fin region;
    forming first dielectric fill material in the fin cut regions;
    planarizing the first dielectric fill and the fin cut mask to a height of the fin etch mask;

after planarizing the first dielectric fill material and the fin cut mask to the height of the fin etch mask, exposing the fin etch mask by removing the fin cut mask;

after exposing the fin etch mask, etching fins in the substrate using the fin etch mask; and forming a shallow trench isolation region in the fin cut regions and the fin region.

9. The method as recited in claim 8, further comprising: forming a fin liner on the first dielectric fill material and exposed portions of the substrate before forming the shallow trench isolation region.

10. The method as recited in claim 9, wherein forming the shallow trench isolation region includes:

filling spaces between the fins by depositing a second dielectric fill over the fin liner;

planarizing the second dielectric fill down to the fin etch mask; and recessing the first dielectric fill and the second dielectric fill to form a shallow trench isolation region in the fin cut regions and the fin region.

11. The method as recited in claim 10, further comprising removing the fin etch mask.

12. The method as recited in claim 8, further comprising:

removing the first dielectric fill; and forming a fin liner on exposed portions of the substrate including the fins before forming the shallow trench isolation region.

13. The method as recited in claim 12, wherein forming the shallow trench isolation region includes:

filling spaces between the fins by depositing a second dielectric fill; and recessing the second dielectric fill to form the shallow trench isolation region in the fin cut regions and the fin region.

14. The method as recited in claim 8, wherein etching the fins in the substrate using the fin etch mask includes etching the substrate in the fin region to a different depth than the fin cut regions.

* * * * *